(12) United States Patent
Hata et al.

(10) Patent No.: US 8,785,957 B2
(45) Date of Patent: Jul. 22, 2014

(54) LIGHT-EMITTING DEVICE

(75) Inventors: Toshio Hata, Osaka (JP); Masayuki Ito, Osaka (JP); Masataka Miyata, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/612,988

(22) Filed: Sep. 13, 2012

(65) Prior Publication Data

US 2013/0062649 A1 Mar. 14, 2013

(30) Foreign Application Priority Data

Sep. 14, 2011 (JP) ................................. 2011-200250

(51) Int. Cl.
*H01L 33/00* (2010.01)
(52) U.S. Cl.
USPC ............................... 257/98; 257/99; 257/100
(58) Field of Classification Search
CPC ................. H01L 2924/00; H01L 2924/00014; H01L 2924/12041; H01L 2924/1815; H01L 2933/005; H01L 2933/0058; H01L 2933/0091; H01L 33/60; H01L 33/50; H01L 33/54; H01L 33/56; H01L 33/46; H01L 33/52; H01L 33/486; H01L 33/58; H01L 33/44; H01L 33/48; H01L 33/502; H01L 33/504; H01L 33/005; H01L 33/24; H01L 33/405; H01L 33/508; H01L 33/08; H01L 33/10; H01L 2224/32225; H01L 21/56; H01L 31/0203; H01L 31/055
USPC ............................................. 257/98, 99, 100
See application file for complete search history.

(56) References Cited

U.S. PATENT DOCUMENTS

| | | | | |
|---|---|---|---|---|
| 7,126,162 | B2 * | 10/2006 | Reeh et al. ....................... | 257/98 |
| 2004/0036079 | A1 * | 2/2004 | Nakada et al. .................. | 257/81 |
| 2004/0066140 | A1 * | 4/2004 | Omoto ........................... | 313/512 |
| 2004/0241894 | A1 * | 12/2004 | Nagai et al. ..................... | 438/22 |
| 2005/0101699 | A1 * | 5/2005 | Yan et al. ........................ | 523/443 |
| 2005/0280017 | A1 | 12/2005 | Oshio et al. | |

(Continued)

FOREIGN PATENT DOCUMENTS

| JP | 2003-101078 | 4/2003 |
|---|---|---|
| JP | 2004-128393 | 4/2004 |

(Continued)

OTHER PUBLICATIONS

English Translation of the Japanese Office Action issued in Application No. 2011-200250 dated Aug. 6, 2013.

*Primary Examiner* — Zandra Smith
*Assistant Examiner* — Sophia Nguyen
(74) *Attorney, Agent, or Firm* — Nixon & Vanderhye, P.C.

(57) ABSTRACT

Disclosed is a light-emitting device having a wide luminous-intensity distribution characteristic with a simple structure. The light-emitting device includes a resin package in which an LED chip, a first inner portion of a first lead terminal, and a second inner portion of a second lead terminal are accommodated and which has a second recess portion formed so that a portion including a first recess portion of the first inner portion of the first lead terminal as well as a portion of the second inner portion of the second lead terminal are exposed to a bottom portion of the second recess portion, and a resin portion containing phosphors and filled in the first recess portion of the first lead terminal and in the second recess portion of the resin package. A photoreflective filler is contained in a region opposed to the LED chip of the resin portion including the phosphors.

18 Claims, 6 Drawing Sheets

(56) References Cited

U.S. PATENT DOCUMENTS

| | | |
|---|---|---|
| 2007/0126020 A1 | 6/2007 | Lin et al. |
| 2007/0241362 A1* | 10/2007 | Han et al. ............... 257/100 |
| 2008/0048193 A1* | 2/2008 | Yoo et al. ................ 257/89 |
| 2008/0237627 A1 | 10/2008 | Kobayakawa |
| 2008/0308825 A1 | 12/2008 | Chakraborty et al. |
| 2009/0309115 A1* | 12/2009 | Hoshino et al. ........... 257/98 |
| 2010/0193821 A1* | 8/2010 | Fukasawa et al. .......... 257/98 |
| 2011/0031525 A1* | 2/2011 | Nemoto et al. ............ 257/99 |
| 2011/0237007 A1* | 9/2011 | An ....................... 438/27 |
| 2011/0309384 A1* | 12/2011 | Ito et al. ................ 257/88 |
| 2012/0161621 A1* | 6/2012 | Sato ...................... 313/512 |
| 2012/0293093 A1* | 11/2012 | Kim ...................... 315/309 |
| 2013/0271042 A1* | 10/2013 | Kim, Yu-Sik .............. 315/309 |
| 2014/0048834 A1* | 2/2014 | Sato et al. ............... 257/98 |

FOREIGN PATENT DOCUMENTS

| | | |
|---|---|---|
| JP | 2005-353914 | 12/2005 |
| JP | 2006-269487 | 10/2006 |
| JP | 2007-227791 | 9/2007 |
| JP | 2008-251937 | 10/2008 |
| JP | 3145956 | 10/2008 |
| JP | 2009-130298 | 6/2009 |
| JP | 2010-529689 | 8/2010 |

* cited by examiner

LIGHT-EMITTING DEVICE

CROSS REFERENCE TO RELATED APPLICATION

This nonprovisional application claims priority under 35 U.S.C. §119(a) on Patent Application No(s). 2011-200250 filed in Japan on Sep. 14, 2011, the entire contents of which are hereby incorporated by reference.

TECHNICAL FIELD

The present invention relates to light-emitting devices including semiconductor light-emitting elements and, more particularly, to light-emitting devices suited for liquid-crystal display devices or planar-shaped lighting devices using a light guide plate.

BACKGROUND ART

A first light-emitting device according to the prior art, as shown in FIG. 10, is so made up that a light-emitting element 810 is sealed by light-pervious resin 820 (see, e.g., JP 2007-227791 A (PTL 1)). In manufacturing process of this light-emitting device, for fulfillment of resin sealing, a phosphor material 830 and a dispersant 840 are previously contained in the light-pervious resin, the phosphor material 830 acting to absorb light derived from the light-emitting element and emit light of a different wavelength. Then, liquid-state light-pervious resin is fed to peripheries of the light-emitting element by potting process, and thereafter the light-pervious resin is cured in a state that the phosphor material is settled so as to be unevenly located more at portions closer to the light-emitting element in the light-pervious resin while the dispersant is dispersed at portions more separate from the light-emitting element than the settling portions of the phosphor material.

A second light-emitting device of the prior art, as shown in FIG. 11, is so made up that a member 920 smaller in refractive index than a light-pervious member 910 of silicone resin, fluorine-based resin or the like is filled inside (see, e.g., JP 2006-269487 A (PTL 2)). In this light-emitting device, in which a hole portion is filled with the member 920, even if the light-pervious member 910 goes to be distorted due to heat generated during operation of a light-emitting element 930, distortions of the light-pervious member 910 can be effectively suppressed by the member 920. Further, in this light-emitting device, by the use of the member 920 that is smaller in refractive index than the light-pervious member 910, when light is outputted from the light-pervious member 910 to the hole portion, the light undergoes larger refraction at an inner surface of the hole portion, so that the light is expanded to an upward wider range. Thus, emission intensity at an upper surface of the light-pervious member 910 positioned immediately above the light-emitting element 930 is prevented from becoming higher as compared with its peripheries, and occurrence of unevenness in emission intensity is prevented.

In the first light-emitting device of the prior art, since the dispersant is dispersed evenly in the whole package (inside), performing luminous-intensity distribution control to obtain wider directional angles is hard to do. Further in the prior-art first light-emitting device, a problem that a place above the LED chip is inevitably brighter is not solved.

Also, in the second light-emitting device of the prior art, which involves a need for providing a hole portion, dimensional control for the hole portion is hard to fulfill. Besides, in the second prior-art light-emitting device, there are problems such as a difficulty in manufacturing process for forming a hole on a surface of a resin within a minute package, and a high possibility that cracks may occur to the resin during the formation of the hole portion. The second prior-art light-emitting device has a difficulty in its manufacturing process.

CITATION LIST

Patent Literature

PTL 1: JP 2007-227791 A
PTL 2: JP 2006-269487 A

SUMMARY OF INVENTION

Technical Problem

Accordingly, an object of the invention is to provide a light-emitting device having a wide luminous-intensity distribution characteristic with a simple structure.

Solution to Problem

In order to solve the problem, a light-emitting device according to the present invention comprises:
a semiconductor light-emitting element;
a lead terminal having a first recess portion for placement of the semiconductor light-emitting element therein;
a resin package in which the semiconductor light-emitting element and a portion of the lead terminal including the first recess portion are accommodated, the resin package also having a second recess portion which is so formed that the portion of the lead terminal including the first recess portion is exposed to a bottom portion of the second recess portion; and
a resin portion containing phosphors filled in the first recess portion of the lead terminal and in the second recess portion of the resin package, wherein
a photoreflective filler is contained in at least a region of the resin portion containing the phosphors that faces the semiconductor light-emitting element.

With this constitution, by placement of the semiconductor light-emitting element in the first recess portion so that the optical axis of emitted light from the semiconductor light-emitting element is directed in an outward direction generally vertical to the opening plane of the first recess portion of the lead terminal, a portion of light emitted from the semiconductor light-emitting element toward an outward direction (optical-axis direction) is transmitted through the resin portion containing the phosphors that is filled in the second recess portion of the resin package, while another portion of the light emitted from the semiconductor light-emitting element is reflected by the photoreflective filler contained at least in the region opposed to the semiconductor light-emitting element of the resin portion containing the phosphors, and then another portion of the light goes toward the bottom side of the second recess portion of the resin package so as to become incident on the region of the resin portion containing the phosphors. Part of the light incident on the region of the resin portion containing the phosphors is converted in wavelength by the phosphors, being radiated outward. Also, part of light emitted from the side face of the semiconductor light-emitting element diagonally toward the bottom side of the first recess portion of the lead terminal also becomes incident on the region of the resin portion containing the phosphors, converted in wavelength and emitted outward. Thus, a luminous-intensity distribution characteristic of a wide directional angle and a light-emitting characteristic of uniform color as a whole can be obtained.

For example, with a light guide plate for extracting light from its upper surface (light-outputting surface) by utilizing reflection of light incident on its side face, light is made to become incident on the side face of the light guide plate by using the light-emitting device having a wide luminous-intensity distribution characteristic, so that brightness unevenness of light outputted from the light-outputting surface of the light guide plate can be prevented, thus causing no occurrence of display unevenness or brightness unevenness in the display screen of the liquid-crystal display device using the light guide plate. The light-emitting device of this invention can also be used preferably for planar-shaped lighting devices or the like using a light guide plate.

In a light-emitting device according to one embodiment, the lead terminal includes:

a first lead terminal which has a first inner portion with a first electrode of the semiconductor light-emitting element connected thereto, and a first outer portion adjoining the first inner portion, and in which the first recess portion is formed in the first inner portion; and a second lead terminal which has a second inner portion with a second electrode of the semiconductor light-emitting element connected thereto, and a second outer portion adjoining the second inner portion, and the semiconductor light-emitting element, the first inner portion of the first lead terminal, and the second inner portion of the second lead terminal are accommodated in the resin package, and the second recess portion is so formed that a portion including the first recess portion of the first inner portion of the first lead terminal and a portion of the second inner portion of the second lead terminal are exposed to the bottom portion of the second recess portion.

According to this embodiment, part of light emitted from the semiconductor light-emitting element is reflected by the photoreflective filler contained at least in a region opposed to the semiconductor light-emitting element of the resin portion containing the phosphors, and then the light going toward the bottom side of the second recess portion of the resin package is not only converted in wavelength by the phosphors but also reflected outward by the portion of the resin portion including the first recess portion of the first inner portion of the first lead terminal exposed to the bottom portion of the second recess portion as well as by the portion of the second inner portion of the second lead terminal. Thus, an even wider luminous-intensity distribution characteristic can be obtained.

In a light-emitting device according to one embodiment, the photoreflective filler is contained in a region of the resin portion containing the phosphors onto which the semiconductor light-emitting element is projected toward a direction generally vertical to a bottom plane of the second recess portion of the resin package.

According to this embodiment, most of light emitted from the semiconductor light-emitting element in an upward direction (optical-axis direction) generally vertically to the bottom plane of the second recess portion of the resin package is reflected by the photoreflective filler contained in the region of the resin portion containing the phosphors to which the semiconductor light-emitting element is projected toward a direction generally vertical to the bottom plane of the second recess portion of the resin package, so that a luminosity of regions in vicinities of the optical axis of the emitted light of the semiconductor light-emitting element in the luminous-intensity distribution characteristics of this light-emitting device can be reduced effectively.

In a light-emitting device according to one embodiment, the resin portion containing the phosphors has a convex lens portion protruding toward a direction generally vertical to a bottom plane of the second recess portion of the resin package.

According to this embodiment, part of light emitted from the semiconductor light-emitting element in a direction generally vertical to the bottom plane of the second recess portion, even if transmitted by the resin portion within the second recess portion of the resin package, is expanded by the convex lens portion of the resin portion, so that the luminosity of regions in vicinities of the optical axis of the emitted light of the semiconductor light-emitting element can be reduced more effectively.

In a light-emitting device according to one embodiment, the semiconductor light-emitting element is mounted on a bottom face of the first recess portion of the lead terminal.

According to this embodiment, since the semiconductor light-emitting element is mounted on the bottom face of the first recess portion of the lead terminal, emitted light from the semiconductor light-emitting element can be reflected effectively by a side wall surface of the first recess portion surrounding the semiconductor light-emitting element.

In a light-emitting device according to one embodiment, the first recess portion of the lead terminal is positioned on a bottom side of the second recess portion of the resin package.

According to this embodiment, since the first recess portion of the lead terminal is positioned on the bottom side of the second recess portion of the resin package, the resin portion can be formed so as to broaden from the semiconductor light-emitting element toward its light-emission direction, so that a wide luminous-intensity distribution characteristic can be obtained.

In a light-emitting device according to one embodiment, the first recess portion of the lead terminal is positioned at a generally center of the bottom side of the second recess portion of the resin package.

According to this embodiment, by the first recess portion of the lead terminal being positioned at a generally center of the bottom side of the second recess portion of the resin package, the resin portion can be formed so as to broaden from the semiconductor light-emitting element toward its light-emission direction, so that a uniform, wide luminous-intensity distribution characteristic can be obtained.

In a light-emitting device according to one embodiment, the second recess portion of the resin package has a rectangular-shaped opening, a wall surface of the first recess portion of the lead terminal is a gentle slope surface which is gently sloped so as to gradually broaden from a bottom side toward an opening of the first recess portion of the lead terminal, a wall surface of the second recess portion of the resin package is a slope surface which is sloped so as to gradually broaden from the bottom side toward the opening of the second recess portion of the resin package, and light derived from the photoreflective filler of the resin portion containing the phosphors and from the phosphors is reflected by surfaces including, as arranged in order along a longer-side direction of the second recess portion of the resin package, the bottom face and the gentle slope surface of the first recess portion of the lead terminal, a flat surface of the lead terminal, and the slope surface of the second recess portion of the resin package.

According to this embodiment, light from the photoreflective filler and the phosphors of the resin portion can be reflected efficiently by utilizing the surfaces arrayed in order along the longer-side direction of the second recess portion of the resin package. The surfaces include the bottom face and the gentle slope surface of the first recess portion of the lead terminal, the flat surface of the lead terminal, and the slope surface of the second recess portion of the resin package.

In a light-emitting device according to one embodiment, the second recess portion of the resin package has a rectangular-shaped opening, a wall surface of the first recess portion of the lead terminal is a gentle slope surface which is gently sloped so as to gradually broaden from a bottom side toward an opening of the first recess portion of the lead terminal, a wall surface of the second recess portion of the resin package is a slope surface which is sloped so as to gradually broaden from the bottom side toward the opening of the second recess portion of the resin package, and light derived from the photoreflective filler of the resin portion containing the phosphors and from the phosphors is reflected by surfaces including, as arranged in order along a shorter-side direction of the second recess portion of the resin package, the bottom face and the gentle slope surface of the first recess portion of the lead terminal, a flat surface of the lead terminal, and the slope surface of the second recess portion of the resin package.

According to this embodiment, light from the photoreflective filler and the phosphors of the resin portion can be reflected efficiently by utilizing the surfaces arrayed in order along the shorter-side direction of the second recess portion of the resin package. The surfaces include the bottom face and the gentle slope surface of the first recess portion of the lead terminal, the flat surface of the lead terminal, and the slope surface of the second recess portion of the resin package.

In a light-emitting device according to one embodiment, a portion having the bottom face and the gentle slope surface of the first recess portion of the lead terminal, and a portion having the flat surface of the lead terminal are made from metal or a layer containing metal.

According to this embodiment, since the portion having the bottom face and the gentle slope surface of the first recess portion of the lead terminal and the portion having the flat portion of the lead terminal are made from metal (or layer containing metal), lustrous reflecting surfaces can be formed and light from the photoreflective filler and the phosphors of the resin portion can be reflected efficiently.

In a light-emitting device according to one embodiment, the bottom face and the gentle slope surface of the first recess portion of the lead terminal, and the flat surface of the lead terminal are continuously formed by an identical material.

According to this embodiment, since the bottom face and the gentle slope surface of the first recess portion of the lead terminal, and the flat portion of the lead terminal are continuously formed by an identical material, light from the photoreflective filler and the phosphors of the resin portion can be reflected without waste.

In a light-emitting device according to one embodiment, the photoreflective filler is contained near a surface of the resin portion containing the phosphors and in a region opposed to the first recess portion of the lead terminal.

According to this embodiment, since the photoreflective filler is contained near the surface of the resin portion containing the phosphors and in the region opposed to the first recess portion of the lead terminal, most of light emitted from the semiconductor light-emitting element toward an upward direction (optical-axis direction) generally vertically to the bottom plane of the second recess portion of the resin package is reflected by the photoreflective filler, so that the luminosity of regions in vicinities of the optical axis of the emitted light of the semiconductor light-emitting element in the luminous- intensity distribution characteristics of this light-emitting device can be reduced effectively.

In a light-emitting device according to one embodiment, in the resin portion containing the phosphors, the phosphors are distributed on a bottom side of the second recess portion of the resin package, and the photoreflective filler is contained in a region near a surface of the resin portion containing the phosphors.

According to this embodiment, light reflected by the photoreflective filler contained near the surface of the resin portion can be led efficiently to the region of the resin portion containing the phosphors distributed on the bottom side of the second recess portion of the resin package.

In a light-emitting device according to one embodiment, in the resin portion containing the phosphors, the phosphors are distributed so as to be dispersed all over the resin portion, and the photoreflective filler is contained near a surface of the resin portion containing the phosphors and in a region opposed to the first recess portion of the lead terminal.

According to this embodiment, light reflected by the photoreflective filler contained near the surface of the resin portion and in the region opposed to the first recess portion of the lead terminal can be converted in wavelength efficiently by the phosphors distributed over the entire resin portion.

Advantageous Effects of Invention

As apparent from the above description, according to the light-emitting device of this invention, there can be realized a light-emitting device having a wide luminous-intensity distribution characteristic with a simple structure.

BRIEF DESCRIPTION OF DRAWINGS

The present invention will become more fully understood from the detailed description given hereinbelow and the accompanying drawings which are given by way of illustration only, and thus are not intended to limit the present invention, and wherein.

DESCRIPTION OF EMBODIMENTS

Hereinbelow, the light-emitting device of the present invention will be described in detail by embodiments thereof illustrated in the accompanying drawings.

First Embodiment

Figure 1:
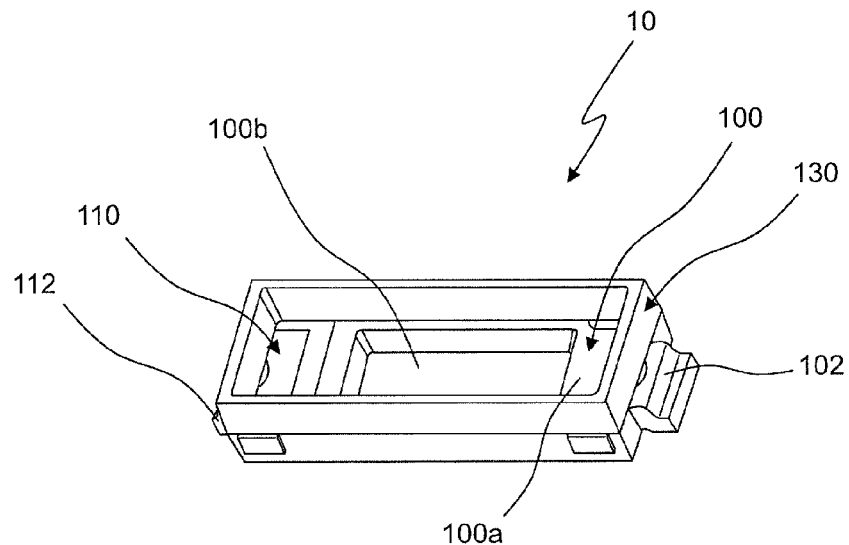
FIG. 1 is a perspective view of a light-emitting device according to a first embodiment of the present invention.
Figure 2:
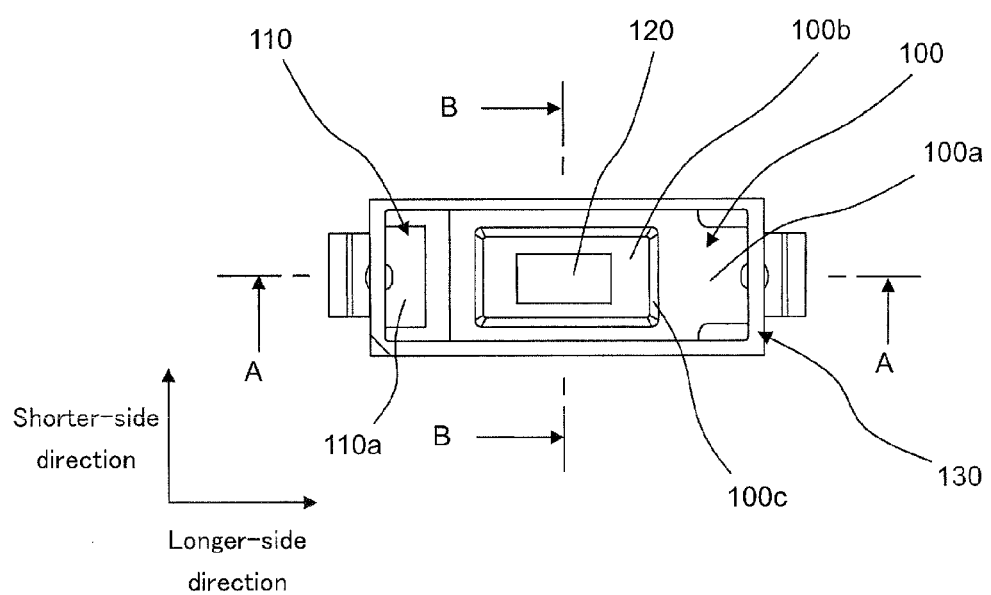
FIG. 2 is a plan view of the light-emitting device.
Figure 3:
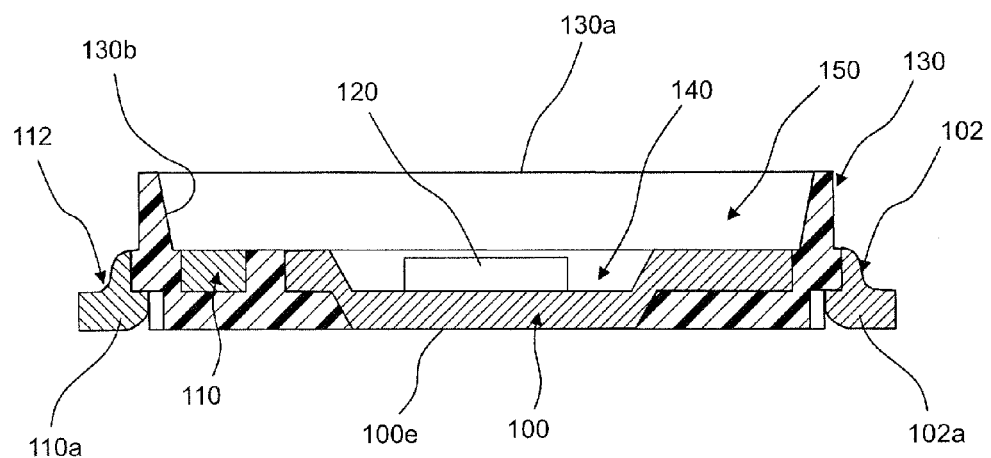
FIG. 3 is a sectional view taken along line A-A of FIG. 2.
Figure 4:
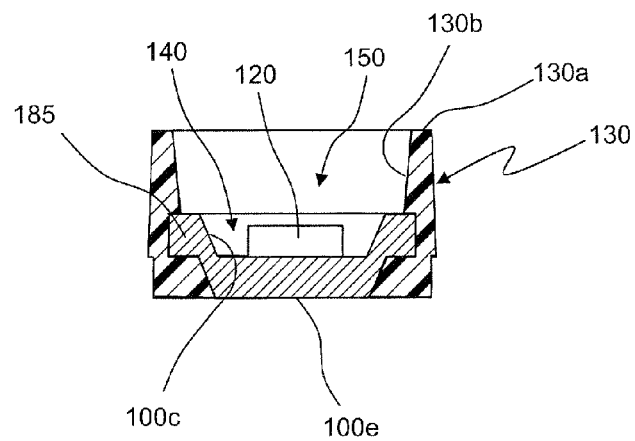
FIG. 4 is a sectional view taken along line B-B of FIG. 2.
Figure 5:
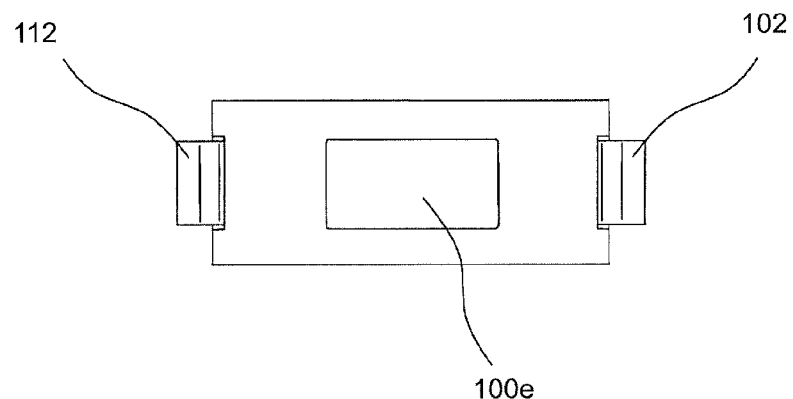
FIG. 5 is a rear face view of the light-emitting device.

FIG. 1 is a perspective view of a light-emitting device 10 according to a first embodiment of the invention. FIG. 2 is a plan view of the light-emitting device 10. FIG. 3 is a sectional view of the light-emitting device 10 taken along the line A-A of FIG. 2. FIG. 4 is a sectional view of the light-emitting device 10 taken along the line B-B of FIG. 2. FIG. 5 is a rear face view of the light-emitting device 10. In FIGS. 1 to 5, wires, resin and the like are omitted in depiction for an easier understanding of structures of resin package 130 inside and first, second lead terminals 100, 110 in the light-emitting device 10.

The light-emitting device 10 of this first embodiment, as shown in FIGS. 1 and 2, has a rectangular-shaped resin package 130 made from PPA (polyphthalamide), and a pair of first, second lead terminals 100, 110.

The first lead terminal 100 has a first inner portion accommodated in the resin package 130, and a first outer portion extending from the first inner portion and positioned outside the resin package 130. In the first inner portion of the first lead terminal 100, a first recess portion 140 for placement of a rectangular-shaped LED chip 120 (shown in FIG. 2) as an example of a semiconductor light-emitting element is formed by drawing process.

The first recess portion 140 of the first lead terminal 100 has a rectangular-shaped bottom portion 100b, and a side wall portion 100c surrounding a periphery of the bottom portion 100b. A wall surface of the side wall portion 100c of the first recess portion 140 is a gentle slope surface which is gently sloped so as to gradually broaden from bottom face toward opening side of the first recess portion 140 of the first lead terminal 100.

An LED chip 120, which is rectangular-shaped in a plan view, is mounted at the bottom portion 100b of the first recess portion 140 of the first lead terminal 100 so that a longer-side direction is oriented toward the same direction as a longer-side direction of the resin package 130. In this case, as shown in FIG. 2, the longer-side direction of the resin package 130 is a direction along the longer-side direction of the LED chip 120 while the shorter-side direction of the resin package 130 is a direction along the shorter-side direction of the LED chip 120.

Meanwhile, the second lead terminal 110 has a second inner portion accommodated in the resin package 130, and a second outer portion extending from the second inner portion and positioned outside the resin package 130. This second lead terminal 110 is placed apart from the first lead terminal 100.

The first, second outer portions of the first, second lead terminals 100, 110 have end portions 102, 112, respectively, having a gull-wing like step gap.

Also, as shown in FIGS. 3 to 5, a rear face (100e) of the bottom portion 100b of the first lead terminal 100 is exposed from the resin package 130.

In this case, reflecting surfaces corresponding to the shorter sides of the LED chip 120, i.e. reflecting surfaces arranged in the longer-side direction of the LED chip 120 are constituted of, as arrayed in order from the LED chip 120 side, a flat surface of the bottom portion 100b of the first recess portion 140 of the first lead terminal 100, the gentle slope surface of the side wall portion 100c of the first recess portion 140, a flat surface of a flat portion 100a of the first lead terminal 100, (a flat surface of a flat surface portion 110a), and a steep slope surface of a side wall portion 130b of the resin package 130. On the other hand, in the case of the second lead terminal 110, reflecting surfaces corresponding to the shorter sides of the LED chip 120, i.e. reflecting surfaces arranged in the longer-side direction of the LED chip 120, are constituted of, as arrayed in order from the LED chip 120 side, the flat surface of the bottom portion 100b of the first recess portion 140 of the first lead terminal 100, the gentle slope surface of the side wall portion 100c of the first recess portion 140, the flat surface of the flat portion 100a of the first lead terminal 100, the flat surface of the flat surface portion 110a of the second lead terminal 110, and the steep slope surface of the side wall portion 130b of the resin package 130.

Furthermore, reflecting surfaces corresponding to the longer sides of the LED chip 120, i.e. reflecting surfaces arranged in the shorter-side direction of the LED chip 120, are constituted of, as arrayed in order from the LED chip 120 side, the flat surface of the bottom portion 100b of the first recess portion 140 of the first lead terminal 100, the gentle slope surface of the side wall portion 100c of the first recess portion 140, the flat surface of the flat portion 100a of the first lead terminal 100, and the steep slope surface of the side wall portion 130b of the resin package 130.

In this light-emitting device, the bottom portion 100b of the first recess portion 140, the side wall portion 100c of the first recess portion 140, and the flat portion 100a in the first lead terminal 100 are made from metal (or a layer containing metal) and continuously formed by an identical material (copper alloy). The side wall portion 130b of the resin package 130 is made from resin.

The first, second lead terminals 100, 110 are formed by a lead frame fabricated by machining of 0.2 mm thick metal plate whose material is copper alloy. In particular, the bottom portion 100b and the side wall portion 100c of the first recess portion 140 of the first lead terminal 100 are formed by drawing process of part of the lead frame. In addition, a flange portion 185 extending outward of the shorter-side direction is formed in the side wall portion 100c of the first recess portion 140 of the first lead terminal 100.

The first, second lead terminals 100, 110 are formed by adopting silver as their material and set to a thickness of 5 µm for improvement of a reflectivity. The first, second lead terminals 100, 110 may be plated with Cu, Ni, Au, Al alloy, Mg alloy, Al—Mg alloy, or the like.

The first, second lead terminals 100, 110 are supported by the resin package 130. The resin package 130 is formed by insert molding of the first, second lead terminals 100, 110.

The first recess portion 140 is provided by an elongate cavity formed by the first lead terminal 100, and a second recess portion 150 is provided by an elongate cavity fabricated with the resin of the resin package 130. The second recess portion 150 is peripherally surrounded by the side wall portion 130b. The wall surface of the side wall portion 130b of the second recess portion 150 in the resin package 130 is a slope surface sloped so as to gradually broaden from bottom plane toward opening side of the second recess portion 150.

In this embodiment, the first recess portion 140 is set to sizes of a shorter-side length of 0.4 mm, a longer-side length of 1 mm, and a depth of 0.2 mm, while the second recess portion 150 is set to sizes of a shorter-side length of 0.6 mm, a longer-side length of 2.4 mm, and a depth of 0.3 mm.

The first, second lead terminals 100, 110 are placed apart from each other within the second recess portion 150. Also, the first, second outer portions of the first, second lead terminals 100, 110, respectively, are formed so as to extend through the shorter-side side walls of the resin package 130 and bent outward in a gull-wing shape with a purpose of electrical connection to an external power supply. Terminal bottom faces 102a, 110a for surface mounting are formed at end portions 102, 112 of the first, second outer portions of the externally extended first, second lead terminals 100, 110 extended outwardly, respectively.

The terminal bottom faces 102a, 110a of the end portions 102, 112 of the first, second lead terminals 100, 110, respectively, are electrically connected to a land (not shown). The terminal bottom faces 102a, 110a of the first, second lead terminals 100, 110, respectively, are solder connected to the electrode land (not shown) in surface mounting process.

Also, the LED chip 120 (width: 0.3 mm, length: 0.6 mm) is mounted in a mounting area of the bottom portion 100b within the first recess portion 140 of the first lead terminal 100 by using silicon resin. A first electrode (not shown) of the LED chip 120 is electrically connected to the flat portion 100a of the first lead terminal 100 (first inner portion) via a bonding wire 160 (shown in FIG. 6), while a second electrode (not shown) of the LED chip 120 is electrically connected to the flat portion 110a of the second lead terminal 110 (second inner portion) via a bonding wire 160 (shown in FIG. 6). Accordingly, light emitted sideways from the LED chip 120 is reflected by an inner wall surface of the first recess portion 140 of the resin package 130, i.e., the gentle slope surface of the side wall portion 100c.

The first lead terminal 100 is plated with a high-reflectivity metal (material: silver, thickness: 5 μm), so being higher in reflectivity than the resin package 130 formed of plastic such as PPA. Therefore, part of light emitted from the LED chip 120 is reflected by the side wall portion 100c having a high reflectivity. Thus, the quantity of light that goes incident directly on the side wall portion 130b of the resin package 130 can be reduced, so that discoloration of the side wall portion 130b of the second recess portion 150 of the resin package 130 can be relaxed, with the result that luminance deteriorations can be reduced.

Figure 6:
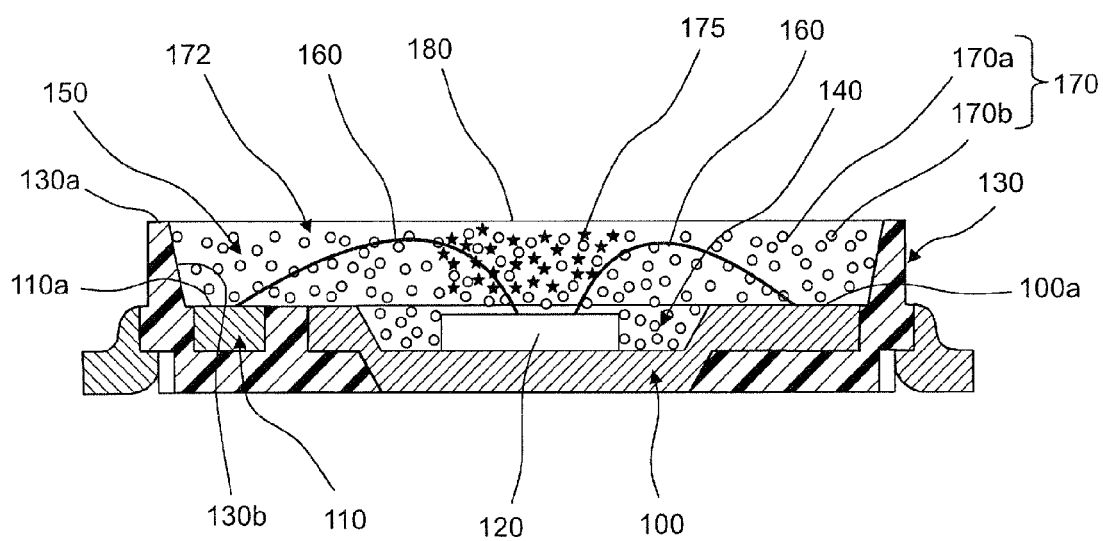
FIG. 6 is a sectional view taken along line A-A of FIG. 2.

FIG. 6 is a sectional view of the bonding wire 160, a resin portion 172 or the like, taken along the line A-A of FIG. 2.

The manufacturing method of the light-emitting device is briefly explained below.

First, silicone resin containing phosphors 170 is filled into the first recess portion 140 of the first lead terminal 100 and into the second recess portion 150 of the resin package 130.

Next, silicone resin containing a photoreflective filler 175 is filled onto the LED chip 120.

Next, under conditions of a curing time of 5 hours and a temperature of 150° C., the silicone resin is cured to form a resin portion 172. Adjustment is made so that a light-emitting surface 180 of the resin portion 172 becomes generally flush with an upper end 130a of the side wall portion 130b of the resin package 130.

In this case, the phosphors 170 (wavelength conversion material) include $(Si.Al)_6(O.N)_8$:Eu as a green phosphor 170a for wavelength conversion of emitted light from the LED chip 120 into green color, and $GaAlSiN_3$:Eu as a red phosphor 170b for wavelength conversion of emitted light from the LED chip 120 into red color. Also, $SiO_2$ is used as the photoreflective filler 175. In addition, the phosphors are not limited to these and a phosphor for wavelength conversion into blue color or the like may also be used, and moreover phosphors may be combined together as appropriate depending on the emission wavelength of the LED chip or the like.

Figure 7:
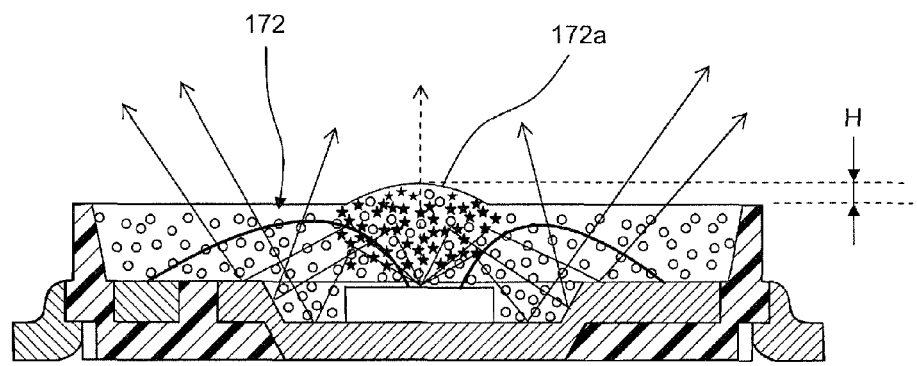
FIG. 7 is a sectional view of a modification of the light-emitting device.

Moreover, as in the modification shown in FIG. 7, an upward-protruding convex lens portion 172a may be provided at the resin portion 172 containing the photoreflective filler 175 on the LED chip 120.

In this light-emitting device shown in FIG. 7, light emitted upward from the LED chip 120 is reflected by the photoreflective filler 175 so as to be incident again in a direction toward the LED chip 120 and on the phosphors 170 within the first recess portion 140 or on the bottom-side phosphors 170 of the second recess portion 150, and light converted by the phosphors 170 is emitted out of the resin package 130. There is almost no light that is radiated directly outside from the LED chip 120.

It is noted that reference sign H refers to a distance from the light-emitting surface 180 to a vertex of the convex portion 172a, i.e., a height of the convex portion 172a. This distance H is preferably 1 mm or less. As to the reason of this, in a case where the light-emitting device shown in FIG. 7 in this embodiment is used as a light source for liquid-crystal backlights, since light is let to enter from the side face of a light guide plate, an optimum value of the distance H is 1 mm or less. With the distance H larger than 1 mm, there is a possibility that the side face of the light guide plate and the light-emitting device may make contact with each other.

Figure 8:
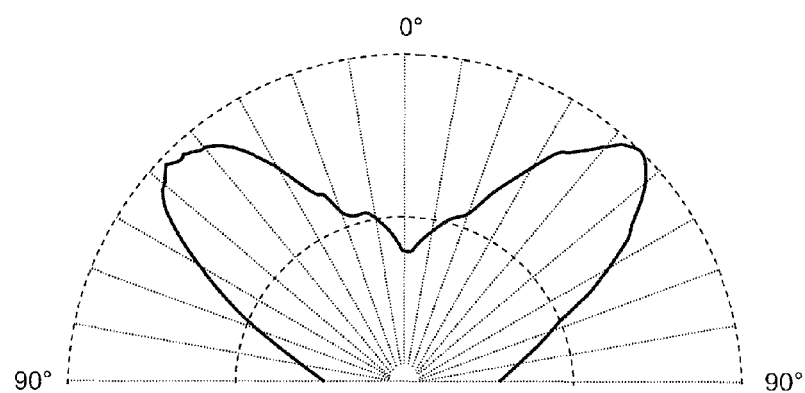
FIG. 8 is a view showing a luminous-intensity distribution characteristic of the light-emitting device.

Next, luminous-intensity distribution characteristics of the light-emitting device of this first embodiment are explained with reference to FIG. 8. In FIG. 8, light directed just upward from the LED chip 120 is reflected by the photoreflective filler 175 so as to be emitted outside in such a direction that the light goes apart from an optical axis of emitted light of the LED chip 120.

Also, the light directed just upward from the LED chip 120 reaches the photoreflective filler 175, being reflected by the photoreflective filler 175 so as to be directed toward the bottom side of the second recess portion 150 where the LED chip 120 is mounted. Since a bottom-side surface of the second recess portion 150 is made from a metallic material having a high reflectivity, light having reached to the bottom side of the second recess portion 150 through reflection by the photoreflective filler 175 is then reflected by the flat surface of the bottom portion 100b of the first recess portion 140 of the first lead terminal 100, the gentle slope surface of the side wall portion 100c of the first recess portion 140, the flat surface of the flat portion 100a of the first lead terminal 100, and the flat surface of the flat portion 110a of the second lead terminal 110 so as to be directed toward the light-emitting surface 180, thus being emitted outside in such a direction that the light goes apart from the optical axis of emitted light of the LED chip 120.

The luminous-intensity distribution characteristics shown in FIG. 8 show that the luminosity comes to a maximum at an angle of from 35° to 45° relative to the optical axis of emitted light of the LED chip 120, and the luminosity becomes lower in vicinities of the optical axis (0°).

The reason why the emitted light of the LED chip 120 is lower in luminosity in regions near the optical axis is that light emitted from the LED chip 120 along the optical axis (0°) is reflected by the photoreflective filler 175 contained in the resin portion 172, so that portions of the emitted light having their luminosity reduced by the reflection are formed.

Meanwhile, light reflected by the photoreflective filler 175 is reflected again by the flat surface of the bottom portion 100b of the first recess portion 140 of the first lead terminal 100, the gentle slope surface of the side wall portion 100c of the first recess portion 140, the flat surface of the flat portion 100a of the first lead terminal 100, and the flat surface of the flat portion 110a of the second lead terminal 110 so as to be emitted outside from the light-emitting surface 180 of the resin portion 172 in vicinities of the photoreflective filler 175, so that the luminosity becomes higher at positions of certain-angle opennesses from the optical axis.

In addition, in order that light reflected by the photoreflective filler 175 is let to be efficiently incident on the phosphors 170 (170a, 170b), it is preferred to make the phosphors 170 (170a, 170b) settled on the bottom side of the resin portion 172. That is, the photoreflective filler is localized on the surface of the resin portion 172 due to differences in specific gravity between the photoreflective filler and the phosphors.

In this connection, preferably, the photoreflective filler 175 is dispersed on the first recess portion 140 and on part of the flat portion 100a. Light reflected by the photoreflective filler 175 can excite the phosphors 170 present on the bottom portion 100b of the first recess portion 140 of the first lead terminal 100, the side wall portion 100c of the first recess portion 140, the flat portion 100a of the first lead terminal 100, and the flat portion 110a of the second lead terminal 110.

Although $SiO_2$ is used as the material of the photoreflective filler 175 in the first embodiment, yet transparent inorganic materials such as $TiO_2$ and $Al_2O_3$ may also be used for the photoreflective filler.

The concentration of $SiO_2$ as the photoreflective filler 175 is preferably set to 0.1 to 8.0 wt %, and its particle size D is set, especially desirably, to 0.2 to 0.4 μm. The shape of $SiO_2$ may be spherical, needle-like, flake-like, or the like.

On condition that the specific gravity of the photoreflective filler 175 is set to 2 to 3 $(g/cm^3)$ while the specific gravity of the phosphors 170 (170a, 170b) is set to 4 to 5 $(g/cm^3)$, it becomes possible to disperse the photoreflective filler 175 in the silicone resin on vicinities (on the LED chip 120) of the first recess portion 140 of the first lead terminal 100.

Also, on condition that the material of the photoreflective filler 175 is $TiO_2$, its shape may be spherical, needle-like, flake-like, or the like. On condition that the material of the photoreflective filler 175 is $Al_2O_3$, its shape may be spherical, needle-like or flake-like or the like.

In this light-emitting device of the first embodiment, a lead frame including a plurality of pairs of first, second lead terminals 100, 110 is subjected to molding of the resin package 130, mounting of the LED chip 120, wire bonding, and filling of the resin portion, and then the lead frame is cut off for each light-emitting device, by which individual light-emitting devices are obtained.

In the light-emitting device of the first embodiment, the LED chip 120 is placed on the first recess portion 140 so that the optical axis of emitted light from the LED chip 120 is generally vertical and outward-oriented with respect to an opening plane of the first recess portion 140 of the first lead terminal 100. Therefore, a portion of light emitted from the LED chip 120 toward an outward direction (optical-axis direction) is transmitted through the resin portion 172 containing the phosphors 170 that is filled in the second recess portion 150 of the resin package 130, while another portion of the light emitted from the LED chip 120 is reflected by the photoreflective filler 175 contained in a region opposed to the LED chip 120 of the resin portion 172 containing the phosphors 170, and then goes toward the bottom side of the second recess portion 150 of the resin package 130 so as to be incident on a region containing the phosphors 170 of the resin portion 172. Part of the light incident on the region containing the phosphors 170 of the resin portion 172 is converted in wavelength by the phosphors 170, being emitted outward. Further, part of light emitted from the side face of the LED chip 120 diagonally toward the bottom side of the first recess portion 140 of the first lead terminal 100 goes incident on the region containing the phosphors 170 in the resin portion 172, being converted in wavelength and emitted outward. Thus, a luminous-intensity distribution characteristic of a wide directional angle and a light-emitting characteristic of uniform color as a whole can be obtained.

According to the light-emitting device described above, white light having a successful luminous-intensity distribution characteristic can be let to become incident on the light guide plate. For example, with the light guide plate for extracting light from its upper surface (light-outputting surface) by utilizing reflection of light incident on its side face, light is made to become incident on the side face of the light guide plate by using the light-emitting device having the wide luminous-intensity distribution characteristic, so that brightness unevenness of light outputted from the light-outputting surface of the light guide plate can be prevented, thus causing no occurrence of display unevenness or brightness unevenness in the display screen of the liquid-crystal display device using the light guide plate. The light-emitting device of this invention can also be used preferably for planar-shaped lighting devices using a light guide plate.

Further, part of light emitted from the LED chip 120 is reflected by the photoreflective filler 175 contained in a region opposed to the LED chip 120 of the resin portion 172 containing the phosphors 170, and then the light going toward the bottom side of the second recess portion 150 of the resin package 130 is not only converted in wavelength by the phosphors 170 but also reflected outward by the portion of the resin portion 172 containing the first recess portion 140 of the first lead terminal 100 exposed to the bottom portion of the second recess portion 150 as well as by the portion of the second lead terminal 110. Thus, the even wider luminous-intensity distribution characteristic can be obtained.

Further, most of light emitted generally vertically to the bottom plane of the second recess portion 150 of the resin package 130 in the upward direction (optical-axis direction) from the LED chip 120 is reflected by the photoreflective filler 175 contained in the region of the resin portion 172 containing the phosphors 170 onto which the LED chip 120 is projected toward a direction generally vertical to the bottom plane of the second recess portion 150 of the resin package 130, so that the luminosity of regions in vicinities of the optical axis of the emitted light of the LED chip 120 in the luminous-intensity distribution characteristics of this light-emitting device can be reduced effectively.

Furthermore, in the resin portion 172, as shown in FIG. 7, the convex lens portion 172a whose lens surface is a spherical surface and which projects toward the direction generally vertical to the bottom plane of the second recess portion 150 of the resin package 130 is provided in the region containing the photoreflective filler 175. As a result of this, part of light emitted from the LED chip 120 toward an outward direction (optical-axis direction), even if transmitted by the resin portion 172 within the second recess portion 150 of the resin package 130, is expanded by the convex lens portion 172a of the resin portion 172, so that the luminosity of regions in vicinities of the optical axis of the emitted light of the LED chip 120 can be reduced more effectively. In addition, the region provided in the convex lens portion of the resin portion is not limited to the region containing the photoreflective filler, and the convex portion of the resin portion may be formed into a larger convex lens portion or a convex lens of other shapes such as aspherical lenses without being limited to spherical lenses.

Furthermore, since the LED chip 120 is mounted on the bottom portion 100b of the first recess portion 140 of the first lead terminal 100, emitted light from the LED chip 120 can be reflected effectively by the side wall portion 100c of the first recess portion 140 surrounding the LED chip 120.

Also, since the first recess portion 140 of the first lead terminal 100 is positioned on the bottom side of the second recess portion 150 of the resin package 130, the resin portion 172 can be formed so as to broaden from the LED chip 120 toward its light-emission direction, so that a wide luminous-intensity distribution characteristic can be obtained.

Also, because the first recess portion 140 of the first lead terminal 100 is positioned at the generally bottom-side center of the second recess portion 150 of the resin package 130, the resin portion 172 can be formed so as to broaden from the LED chip 120 toward its light-emission direction, so that a uniform, wide luminous-intensity distribution characteristic can be obtained.

Further, light from the photoreflective filler 175 and the phosphors 170 of the resin portion 172 can be reflected efficiently by utilizing the surfaces arrayed in order along the longer-side direction of the second recess portion 150 of the resin package 130, the surfaces including the bottom face of the bottom portion 100b and the gentle slope surface of the side wall portion 100c of the first recess portion 140 of the first lead terminal 100, the flat surface of the flat portion 100a of the first lead terminal 100, (the flat surface of the flat portion 110a in the case of the second lead terminal 110 side), and the slope surface of the side wall portion 130b of the second recess portion 150 of the resin package 130.

Also, light from the photoreflective filler 175 and the phosphors 170 of the resin portion 172 can be reflected efficiently by utilizing the surfaces arrayed in order along the shorter-side direction of the second recess portion 150 of the resin package 130, the surfaces including the bottom face of the bottom portion 100b and the gentle slope surface of the side wall portion 100c of the first recess portion 140 of the first lead terminal 100, the flat surface of the flat portion 100a of the first lead terminal 100, and the slope surface of the side wall portion 130b of the second recess portion 150 of the resin package 130.

Also, because the bottom portion 100b and the side wall portion 100c of the first recess portion 140 of the first lead terminal 100, and the flat portion 100a of the first lead terminal 100 are made from metal (or layer containing metal), lustrous reflecting surfaces can be formed and light from the photoreflective filler 175 and the phosphors 170 of the resin portion 172 can be reflected efficiently.

Also, because the bottom portion 100b and the side wall portion 100c of the first recess portion 140 of the first lead terminal 100, and the flat portion 100a of the first lead terminal 100 are continuously formed by an identical material, light from the photoreflective filler 175 and the phosphors 170 of the resin portion 172 can be reflected without waste.

Also, because the photoreflective filler 175 is contained near the surface of the resin portion 172 containing the phosphors 170 and in the region opposed to the first recess portion 140 of the first lead terminal 100, most of light emitted from the LED chip 120 toward the upward direction (optical-axis direction) generally vertically to the bottom plane of the second recess portion 150 of the resin package 130 is reflected by the photoreflective filler 175, so that the luminosity of regions in vicinities of the optical axis of the emitted light of the LED chip 120 in the luminous-intensity distribution characteristics of this light-emitting device can be reduced effectively.

Also, light reflected by the photoreflective filler 175 contained in the region near the surface of the resin portion 172 can be led efficiently to the region of the resin portion 172 containing the phosphors 170 distributed on the bottom side of the second recess portion 150 of the resin package 130.

Also, light reflected by the photoreflective filler 175 contained near the surface of the resin portion 172 and in the region opposed to the first recess portion 140 of the first lead terminal 100 can be converted in wavelength uniformly and efficiently by the phosphors 170 distributed over the entire resin portion 172.

Second Embodiment

Figure 9:
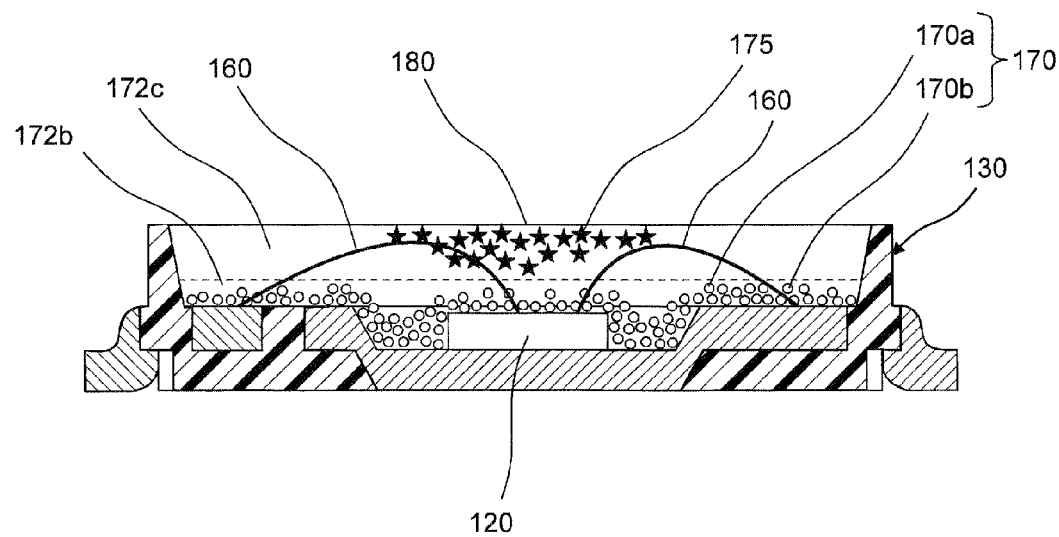
FIG. 9 is a sectional view of a light-emitting device according to a second embodiment of the invention.
Figure 10:
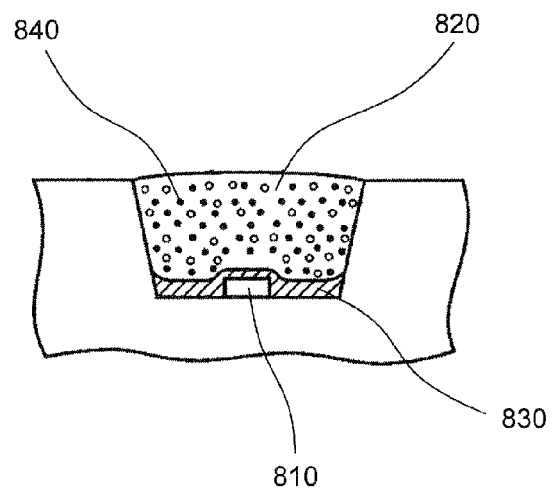
FIG. 10 is a sectional view of a first light-emitting device according to the prior art.
Figure 11:
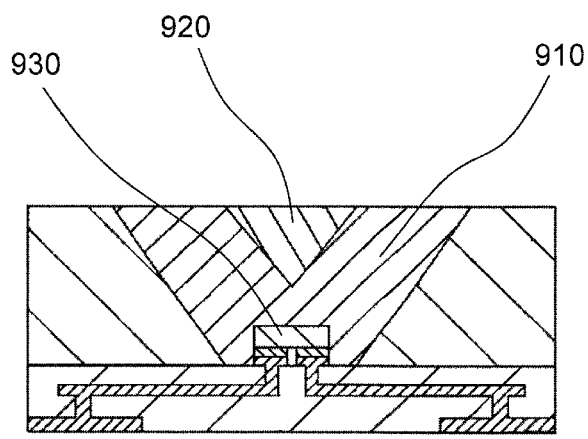
FIG. 11 is a sectional view of a second light-emitting device according to the prior art.

FIG. 9 is a sectional view of a light-emitting device according to a second embodiment of the invention. The light-emitting device of this second embodiment, except a distribution state of a phosphors and a photoreflective filler in a resin portion, is similar in structure to the light-emitting device of the first embodiment, and like component members are designated by like reference signs.

First, silicone resin 172b containing phosphors 170 (170a, 170b) is filled into the first recess portion 140 and the second recess portion 150. In this case, the curing was performed under conditions of a curing time of 1 hour and a temperature of 80° C.

Thereafter, silicone resin 172c containing a photoreflective filler 175 is filled into the second recess portion 150 (conditions of curing time: 5 hours, temperature: 150° C.). These silicone resins 172b, 172c constitute the resin portion 172. In addition, as shown in FIG. 7, a convex lens portion may also be provided on the silicone resin 172c containing the photoreflective filler 175 above the LED chip 120.

(Phosphors)

In this case, for the phosphors 170 (wavelength conversion material), $(Si.Al)_6(O.N)_3$:Eu was used as a green phosphor 170a, and $GaAlSiN_3$:Eu was used as a red phosphor 170b.

Light emitted upward from the LED chip 120 is reflected by the photoreflective filler 175 so as to be incident again in a direction toward the LED chip 120 on the phosphor 170 side within the first recess portion 140 or on the phosphors 170 (170a, 170b) on the bottom plane of the second recess portion 150, and light converted by the phosphors 170 (170a, 170b) is emitted out of the resin package 130. There is almost no light that is radiated from on the LED chip 120.

In this light-emitting device of the second embodiment, a lead frame including a plurality of pairs of first, second lead terminals 100, 110 is subjected to molding of the resin package 130, mounting of the LED chip 120, wire bonding, and filling of the resin portion, and then the lead frame is cut off for each light-emitting device, by which individual light-emitting devices are obtained.

The light-emitting device of the second embodiment has the same effects as those of the light-emitting device of the first embodiment.

The first, second embodiments have been described on light-emitting devices in which the photoreflective filler 175 is contained in a region of the resin portion 172 opposed to the conductor light-emitting element. However, the photoreflective filler may also be contained in a region other than the region opposed to a semiconductor light-emitting element of the resin portion containing phosphors.

Although specific embodiments of the invention have been described hereinabove, yet the invention is not limited to the above-described first, second embodiments and may be changed and modified in various ways within the scope of the invention.

For the light-emitting device of the invention, light is made to become incident on a light guide plate for extracting light from its upper surface by utilizing reflection of light incident on its side face in a wide luminous-intensity distribution characteristic, so that brightness unevenness of light outputted from the light-outputting surface of the light guide plate can be prevented. Thus, the light-emitting device can be applied to large-scale planar-shaped lighting devices or liquid-crystal display devices using a light guide plate.

Embodiments of the invention being thus described, it will be obvious are not to be regarded as a departure from the spirit and scope of the invention, and all such modifications as would be obvious to one skilled in the art are intended to be included within the scope of the following claims.

REFERENCE SIGNS LIST 10 light-emitting device
100 first lead terminal
100a, 110a flat portion
100b bottom portion
100c side wall portion
100e rear face
102, 112 end portion
110 second lead terminal
120 LED chip
130 resin package
130a upper end
130b side wall portion
140 first recess portion
150 second recess portion
150 bonding wire
170 phosphor
170a green phosphor
170b red phosphor
172 resin portion
175 photoreflective filler
185 flange portion

The invention claimed is:

1. A light-emitting device comprising:
a semiconductor light-emitting element;
a lead terminal having a first recess portion for placement of the semiconductor light-emitting element therein;
a resin package in which the semiconductor light-emitting element and a portion of the lead terminal including the first recess portion are accommodated, the resin package also having a second recess portion which is so formed that the portion of the lead terminal including the first recess portion is exposed to a bottom portion of the second recess portion; and
a resin portion containing phosphors filled in the first recess portion of the lead terminal and in the second recess portion of the resin package, wherein
a photoreflective filler is contained in the resin portion containing the phosphors,
the second recess portion of the resin package has a rectangular-shaped opening,
a wall surface of the first recess portion of the lead terminal is a gentle slope surface which is gently sloped so as to gradually broaden from a bottom side toward an opening of the first recess portion of the lead terminal,
a wall surface of the second recess portion of the resin package is a slope surface which is sloped so as to gradually broaden from the bottom side toward the opening of the second recess portion of the resin package, and
light derived from the photoreflective filler of the resin portion containing the phosphors and from the phosphors is reflected by surfaces including, as arranged in order along a longer-side direction of the second recess portion of the resin package, the bottom face and the gentle slope surface of the first recess portion of the lead terminal, a flat surface of the lead terminal, and the slope surface of the second recess portion of the resin package.

2. The light-emitting device as claimed in claim 1, wherein the lead terminal includes:
a first lead terminal which has a first inner portion with a first electrode of the semiconductor light-emitting element connected thereto, and a first outer portion adjoining the first inner portion, and in which the first recess portion is formed in the first inner portion; and
a second lead terminal which has a second inner portion with a second electrode of the semiconductor light-emitting element connected thereto, and a second outer portion adjoining the second inner portion, and
the semiconductor light-emitting element, the first inner portion of the first lead terminal, and the second inner portion of the second lead terminal are accommodated in the resin package, and the second recess portion is so formed that a portion including the first recess portion of the first inner portion of the first lead terminal and a portion of the second inner portion of the second lead terminal are exposed to the bottom portion of the second recess portion.

3. The light-emitting device as claimed in claim 1, wherein the photoreflective filler is contained in a region of the resin portion containing the phosphors onto which the semiconductor light-emitting element is projected toward a direction generally vertical to a bottom plane of the second recess portion of the resin package.

4. The light-emitting device as claimed in claim 1, wherein the semiconductor light-emitting element is mounted on a bottom face of the first recess portion of the lead terminal.

5. The light-emitting device as claimed in claim 1, wherein the first recess portion of the lead terminal is positioned on a bottom side of the second recess portion of the resin package.

6. The light-emitting device as claimed in claim 5, wherein the first recess portion of the lead terminal is positioned at a generally center of the bottom side of the second recess portion of the resin package.

7. The light-emitting device as claimed in claim 1, wherein the photoreflective filler is contained near a surface of the resin portion containing the phosphors and in a region opposed to the first recess portion of the lead terminal.

8. The light-emitting device as claimed in claim 1, wherein in the resin portion containing the phosphors, the phosphors are distributed on a bottom side of the second recess portion of the resin package, and the photoreflective filler is contained in a region near a surface of the resin portion containing the phosphors.

9. The light-emitting device as claimed in claim 1, wherein in the resin portion containing the phosphors, the phosphors are distributed so as to be dispersed all over the resin portion, and
the photoreflective filler is contained near a surface of the resin portion containing the phosphors and in a region opposed to the first recess portion of the lead terminal.

10. A light-emitting device comprising:
a semiconductor light-emitting element;
a lead terminal having a first recess portion for placement of the semiconductor light-emitting element therein;
a resin package in which the semiconductor light-emitting element and a portion of the lead terminal including the first recess portion are accommodated, the resin package also having a second recess portion which is so formed that the portion of the lead terminal including the first recess portion is exposed to a bottom portion of the second recess portion; and
a resin portion containing phosphors filled in the first recess portion of the lead terminal and in the second recess portion of the resin package, wherein
a photoreflective filler is contained in the resin portion containing the phosphors,
the second recess portion of the resin package has a rectangular-shaped opening, a wall surface of the first recess portion of the lead terminal is a gentle slope surface which is gently sloped so as to gradually broaden from a bottom side toward an opening of the first recess portion of the lead terminal, a wall surface of the second recess portion of the resin package is a slope surface which is sloped so as to gradually broaden from the bottom side toward the opening of the second recess portion of the resin package, and light derived from the photoreflective filler of the resin portion containing the phosphors and from the phosphors is reflected by surfaces including, as arranged in order along a shorter-side direction of the second recess portion of the resin package, the bottom face and the gentle slope surface of the first recess portion of the lead terminal, a flat surface of the lead terminal, and the slope surface of the second recess portion of the resin package.

11. The light-emitting device as claimed in claim 10, wherein the lead terminal includes:

a first lead terminal which has a first inner portion with a first electrode of the semiconductor light-emitting element connected thereto, and a first outer portion adjoining the first inner portion, and in which the first recess portion is formed in the first inner portion; and a second lead terminal which has a second inner portion with a second electrode of the semiconductor light-emitting element connected thereto, and a second outer portion adjoining the second inner portion, and the semiconductor light-emitting element, the first inner portion of the first lead terminal, and the second inner portion of the second lead terminal are accommodated in the resin package, and the second recess portion is so formed that a portion including the first recess portion of the first inner portion of the first lead terminal and a portion of the second inner portion of the second lead terminal are exposed to the bottom portion of the second recess portion.

12. The light-emitting device as claimed in claim 10, wherein the photoreflective filler is contained in a region of the resin portion containing the phosphors onto which the semiconductor light-emitting element is projected toward a direction generally vertical to a bottom plane of the second recess portion of the resin package.

13. The light-emitting device as claimed in claim 10, wherein the semiconductor light-emitting element is mounted on a bottom face of the first recess portion of the lead terminal.

14. The light-emitting device as claimed in claim 10, wherein the first recess portion of the lead terminal is positioned on a bottom side of the second recess portion of the resin package.

15. The light-emitting device as claimed in claim 14, wherein the first recess portion of the lead terminal is positioned at a generally center of the bottom side of the second recess portion of the resin package.

16. The light-emitting device as claimed in claim 10, wherein the photoreflective filler is contained near a surface of the resin portion containing the phosphors and in a region opposed to the first recess portion of the lead terminal.

17. The light-emitting device as claimed in claim 10, wherein in the resin portion containing the phosphors, the phosphors are distributed on a bottom side of the second recess portion of the resin package, and the photoreflective filler is contained in a region near a surface of the resin portion containing the phosphors.

18. The light-emitting device as claimed in claim 10, wherein in the resin portion containing the phosphors, the phosphors are distributed so as to be dispersed all over the resin portion, and the photoreflective filler is contained near a surface of the resin portion containing the phosphors and in a region opposed to the first recess portion of the lead terminal.

\* \* \* \* \*